(12) United States Patent
Asada

(10) Patent No.: US 11,714,351 B2
(45) Date of Patent: Aug. 1, 2023

(54) IMPRINT APPARATUS AND ARTICLE MANUFACTURING METHOD

(71) Applicant: CANON KABUSHIKI KAISHA, Tokyo (JP)

(72) Inventor: Kunihiko Asada, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/711,982

(22) Filed: Dec. 12, 2019

(65) Prior Publication Data

US 2020/0201171 A1 Jun. 25, 2020

(30) Foreign Application Priority Data

Dec. 20, 2018 (JP) ................................. 2018-238651

(51) Int. Cl.
*G03F 7/00* (2006.01)
*B29C 33/42* (2006.01)

(52) U.S. Cl.
CPC .......... *G03F 7/0002* (2013.01); *B29C 33/424* (2013.01); *G03F 7/0022* (2013.01); *B29C 2033/426* (2013.01)

(58) Field of Classification Search
CPC ... G03F 7/0002; G03F 7/0022; B29C 33/424; B29C 2033/426
See application file for complete search history.

(56) References Cited

U.S. PATENT DOCUMENTS

| | | | |
|---|---|---|---|
| 2011/0273684 A1* | 11/2011 | Owa | B29C 43/003 355/53 |
| 2013/0207288 A1 | 8/2013 | Mikami | |
| 2016/0243753 A1* | 8/2016 | Hatano | G03F 7/0002 |
| 2018/0074419 A1* | 3/2018 | Jung | G03F 9/7042 |
| 2019/0221421 A1* | 7/2019 | Fukuhara | G03F 7/0002 |

FOREIGN PATENT DOCUMENTS

| | | |
|---|---|---|
| JP | 2013069918 A | 4/2013 |
| JP | 2013168504 A | 8/2013 |
| JP | 2015173271 A | 10/2015 |
| JP | 2016058735 A | 4/2016 |

\* cited by examiner

*Primary Examiner* — Alison L Hindenlang
*Assistant Examiner* — Alexander A Wang
(74) *Attorney, Agent, or Firm* — Rossi, Kimms & McDowell LLP

(57) ABSTRACT

Imprint apparatus brings pattern region of mold into contact with imprint material on shot region of substrate, aligns the shot region and the pattern region with each other, and cures the imprint material. The apparatus includes light irradiator which irradiates the imprint material with light. In state that the imprint material on the shot region and the pattern region are in contact and the pattern region is flat, the light irradiator performs preliminary exposure of irradiating the imprint material with the light to increase viscosity of the imprint material. In the preliminary exposure, the light irradiator irradiates the imprint material with the light under illuminance distribution determined such that illuminance in contact beginning region where the imprint material and the pattern region begin to contact is lower than illuminance in certain region different from the contact beginning region.

12 Claims, 10 Drawing Sheets

FIG. 8A

| 5.00 | 5.00 | 5.00 | 5.00 |
|------|------|------|------|
| 5.00 | 5.00 | 5.00 | 5.00 |
| 5.00 | 5.00 | 5.00 | 5.00 |
| 5.00 | 5.00 | 5.00 | 5.00 |
| 5.00 | 5.00 | 5.00 | 5.00 |

FIG. 8B

| 5.00 | 5.00 | 5.00 | 5.00 |
|------|------|------|------|
| 5.00 | 5.00 | 5.00 | 5.00 |
| 5.00 | 3.00 | 3.00 | 5.00 |
| 5.00 | 5.00 | 5.00 | 5.00 |
| 5.00 | 5.00 | 5.00 | 5.00 |

FIG. 8C

| 5.20 | 5.20 | 5.20 | 5.20 |
|------|------|------|------|
| 5.20 | 5.20 | 5.20 | 5.20 |
| 5.20 | 3.20 | 3.20 | 5.20 |
| 5.20 | 5.20 | 5.20 | 5.20 |
| 5.20 | 5.20 | 5.20 | 5.20 |

FIG. 8D

| 5.22 | 5.22 | 5.22 | 5.22 |
|------|------|------|------|
| 5.22 | 5.22 | 5.22 | 5.22 |
| 5.22 | 3.00 | 3.00 | 5.22 |
| 5.22 | 5.22 | 5.22 | 5.22 |
| 5.22 | 5.22 | 5.22 | 5.22 |

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

An imprint apparatus brings a pattern region of a mold into contact with an imprint material on a shot region of a substrate, and in this state, cures the imprint material by light irradiation, thereby forming a pattern on the shot region. In the imprint apparatus, alignment between the shot region and the pattern region is performed in a state in which the mold and the imprint material on the shot region are in contact. This alignment can be performed while detecting an alignment error between the shot region of the substrate and the pattern region of the mold by an alignment scope.

If the viscoelasticity of the imprint material is high, the substrate and the mold are connected by the imprint material, and relative vibrations between the substrate and the mold are reduced. Hence, if the viscoelasticity of the imprint material is high, alignment between the shot region of the substrate and the pattern region of the mold is easy. On the other hand, if the viscoelasticity of the imprint material is low, the substrate and the mold may vibrate independently of each other. For this reason, alignment between the shot region of the substrate and the pattern region of the mold is difficult, and the alignment accuracy may lower.

Japanese Patent Laid-Open No. 2016-058735 describes that when the contact region between a resin (imprint material) on a substrate and a mold spreads from the center to the periphery, a light irradiation region is changed in accordance with expansion of the region where the mold and the resin are in contact.

As described above, increasing the viscoelasticity of the imprint material for alignment is advantageous for raising the accuracy of alignment. However, an increase in the viscoelasticity of the imprint material may impede filling of the imprint material in a concave portion of the pattern region of the mold or in a space between the substrate and the pattern region. The impediment of filling of the imprint material may cause lowering of throughput and/or lowering of yield.

SUMMARY OF THE INVENTION

The present invention provides a technique advantageous in suppressing lowering of throughput and/or lowering of yield caused by increasing the viscoelasticity of an imprint material at the time of alignment.

One of aspects of the present invention provides an imprint apparatus that brings a pattern region of a mold into contact with an imprint material on a shot region of a substrate, aligns the shot region and the pattern region with each other, and cures the imprint material, thereby forming a pattern constituted by a cured product of the imprint material on the substrate, the apparatus comprising: a light irradiator configured to irradiate the imprint material with light, wherein in a state in which the imprint material on the shot region and the pattern region are in contact, and the pattern region is flat, the light irradiator performs preliminary exposure of irradiating the imprint material with the light to increase viscosity of the imprint material, and in the preliminary exposure, the light irradiator irradiates the imprint material with the light under an illuminance distribution determined such that an illuminance in a contact beginning region where the imprint material and the pattern region begin to contact is lower than an illuminance in a certain region different from the contact beginning region.

Further features of the present invention will become apparent from the following description of exemplary embodiments with reference to the attached drawings.

BRIEF DESCRIPTION OF THE DRAWINGS

FIGS. 8A to 8D are views for explaining an example in which an irradiation integrated amount is adjusted by adjusting an illuminance.

DESCRIPTION OF THE EMBODIMENTS

An exemplary embodiment of the present invention will now be described with reference to the accompanying drawings.

Figure 1:
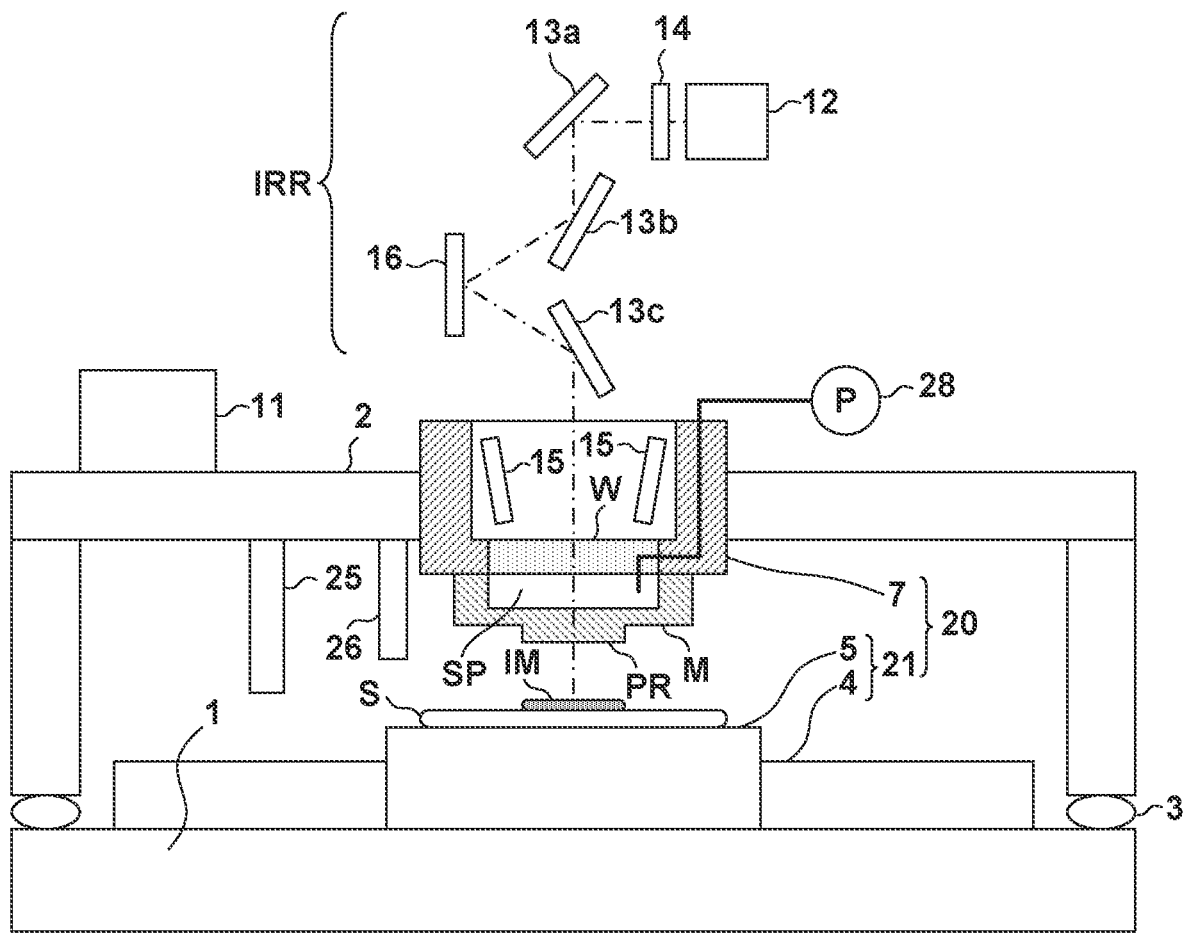
FIG. 1 is a view showing the arrangement of an imprint apparatus according to an embodiment of the present invention.

FIG. 1 schematically shows the arrangement of an imprint apparatus 100 according to an embodiment of the present invention. The imprint apparatus 100 brings a pattern region PR of a mold M into contact with an imprint material IM on a substrate S, aligns the substrate S and the pattern region PR with each other, and after that, cures the imprint material IM. A pattern constituted by the cured product of the imprint material IM is thus formed on the substrate S. The substrate S includes one or a plurality of shot regions. The imprint apparatus 100 brings the pattern region PR of the mold M into contact with the imprint material IM on the shot region of the substrate S, aligns the shot region and the pattern region PR with each other, and after that, cures the imprint material IM.

As an imprint material, a curable composition (to be also referred to as a resin in an uncured state) to be cured by receiving curing energy is used. As the curing energy, an electromagnetic wave can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation. Among compositions, a photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

In the specification and the accompanying drawings, directions will be indicated on an XYZ coordinate system in which directions parallel to the surface of the substrate S are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the ex-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation. Alignment (positioning) can include controlling the position and/or orientation of at least one of the substrate S and the mold M such that the alignment error (overlay error) between the shot region of the substrate S and the pattern region of the mold M decreases. In addition, alignment can include control to correct or change the shape of at least one of the shot region of the substrate S and the pattern region of the mold M.

The imprint apparatus 100 can include a base plate 1, a damper 3, a frame 2, a relative driving mechanism 20, an adjustment mechanism 28, a light irradiator IRR, an alignment scope 15, a dispenser 25, a purge gas supply unit 26, and a control unit 11. The relative driving mechanism 20 changes the relative position between the shot region of the substrate S and the pattern region PR of the mold M. Adjustment of the relative position by the relative driving mechanism 20 includes driving for bringing the mold M in contact with the imprint material IM on the substrate S and separating the mold M from the cured imprint material IM (the pattern of the cured product). In addition, adjustment of the relative position by the relative driving mechanism 20 includes alignment between (the shot region of) the substrate S and (the pattern region PR of) the mold M. The relative driving mechanism 20 can include a substrate positioning mechanism 21 that positions (the shot region of) the substrate S, and a mold positioning mechanism 7 that positions (the pattern region PR of) the mold M.

The substrate positioning mechanism 21 can include a substrate holding unit 5 that holds the substrate S, and a substrate driving mechanism 4 that drives the substrate S by driving the substrate holding unit 5. The substrate holding unit 5 and the substrate driving mechanism 4 can be supported by the base plate 1. The substrate driving mechanism 4 can be configured to drive the substrate S concerning a plurality of axes (for example, three axes including the X-, Y-, and θZ-axes, preferably, six axes including the X-, Y-, Z-, θX-, θY-, and θZ-axes). The imprint apparatus 100 can include a measuring device (for example, an interferometer or an encoder) that measures the position of the substrate S or the substrate holding unit 5, and the position of the substrate holding unit 5 can be feedback-controlled based on the output of the measuring device. The mold positioning mechanism 7 can include a mold holding unit (not shown) that holds the mold M, and a mold driving mechanism (not shown) that drives the mold M by driving the mold holding unit. The mold positioning mechanism 7 can be configured to drive the mold M concerning a plurality of axes (for example, three axes including the Z-, θX-, and θY-axes, preferably, six axes including the X-, Y-, Z-, θX-, θY-, and θZ-axes).

The imprint apparatus 100 can further include an adjustment mechanism 28 that adjusts the shape (the shape on a plane parallel to the Z-axis) of the mold M such that the contact region between the imprint material IM and the pattern region PR increases after the imprint material IM on the substrate S and the pattern region PR come into partial contact. The adjustment mechanism 28 can adjust the shape of the mold M by adjusting the pressure in a space SP formed on the side of the lower surface of the mold M (the surface on the opposite side of the pattern region PR). The mold M can expand in a convex shape toward the substrate S or obtain a flat shape by the adjustment mechanism 28.

The frame 2 can be provided on the base plate 1 via the damper 3. The damper 3 reduces transmission of a vibration from the base plate 1 to the frame 2. The mold positioning mechanism 7 can be supported by the frame 2. The light irradiator IRR is configured to irradiate the imprint material IM on the shot region of the substrate S with light (in other words, expose the imprint material IM). The mold positioning mechanism 7 includes a window W that defines the space SP while transmitting light, and the light irradiator IRR can be configured to irradiate the imprint material IM with light through the window W.

The light irradiator IRR can include, for example, a light source 12, a shutter 14, mirrors 13a, 13b, and 13c, and a spatial light modulator 16. In accordance with an instruction from the control unit 11, the spatial light modulator 16 can control the illuminance distribution of light with which the imprint material IM on the shot region of the substrate S is irradiated. The spatial light modulator 16 can be formed by, for example, a digital mirror device. The digital mirror device includes a plurality of mirrors that can be controlled individually, and can control, by the angle of each of the plurality of mirrors, the illuminance distribution of light with which the imprint material IM is irradiated. In place of the spatial light modulator 16, for example, a liquid crystal spatial light modulator may be used.

Light irradiation for the imprint material IM on the shot region of the substrate S, that is, exposure of the imprint material IM can include preliminary exposure and main exposure. The light irradiator IRR may include a plurality of light sources whose light emission wavelengths and/or light emission intensities are different from each other. For example, in preliminary exposure, at least one light source corresponding to the preliminary exposure can be used. In main exposure, at least one light source corresponding to the main exposure can be used. In this case, a spatial light modulator common to the plurality of light sources may be provided. Alternatively, a plurality of spatial light modulators may be provided in correspondence with the plurality of light sources.

The alignment scope 15 is used to detect the alignment error between the shot region of the substrate S and the pattern region PR of the mold M. The relative position between a mark provided in the shot region and a mark provided in the pattern region PR can be detected using the alignment scope 15. Relative positions are detected for a plurality of mark pairs (each mark pair is formed by a mark provided in the shot region and a mark provided in the pattern region PR), thereby detecting the alignment error between the shot region of the substrate S and the pattern region PR of the mold M. In the imprint apparatus 100, a die-by-die alignment method can be used as the method of alignment between the shot region of the substrate S and the pattern region PR of the mold M.

The dispenser 25 (supply unit) arranges (supplies) the imprint material IM on the shot region of the substrate S. The dispenser 25 may be configured or controlled to arrange the imprint material IM on a plurality of shot regions of the substrate S. The imprint material IM can be arranged on the substrate S when the imprint material IM is discharged from the dispenser 25 while the substrate S is scanned or driven by the substrate positioning mechanism 21. The imprint material IM may be arranged on the substrate S in an external apparatus of the imprint apparatus 100, and the substrate S on which the imprint material IM is arranged may be provided to the imprint apparatus 100.

The purge gas supply unit 26 can supply a purge gas onto the substrate S to improve the filling property of the imprint material IM and suppress impediment of curing of the imprint material IM by oxygen. As the purge gas, a gas that does not impede curing of the imprint material, for example, a gas containing at least one of helium gas, nitrogen gas, and a condensable gas (for example, pentafluoropropane (PFP)) can be used. The purge gas supplied onto the substrate S can be transferred under the pattern region PR of the mold M as the substrate S moves.

The control unit 11 can be configured to control the relative driving mechanism 20, the adjustment mechanism 28, the light irradiator IRR, the alignment scope 15, the dispenser 25, and the purge gas supply unit 26. The control unit 11 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components.

Figure 2:
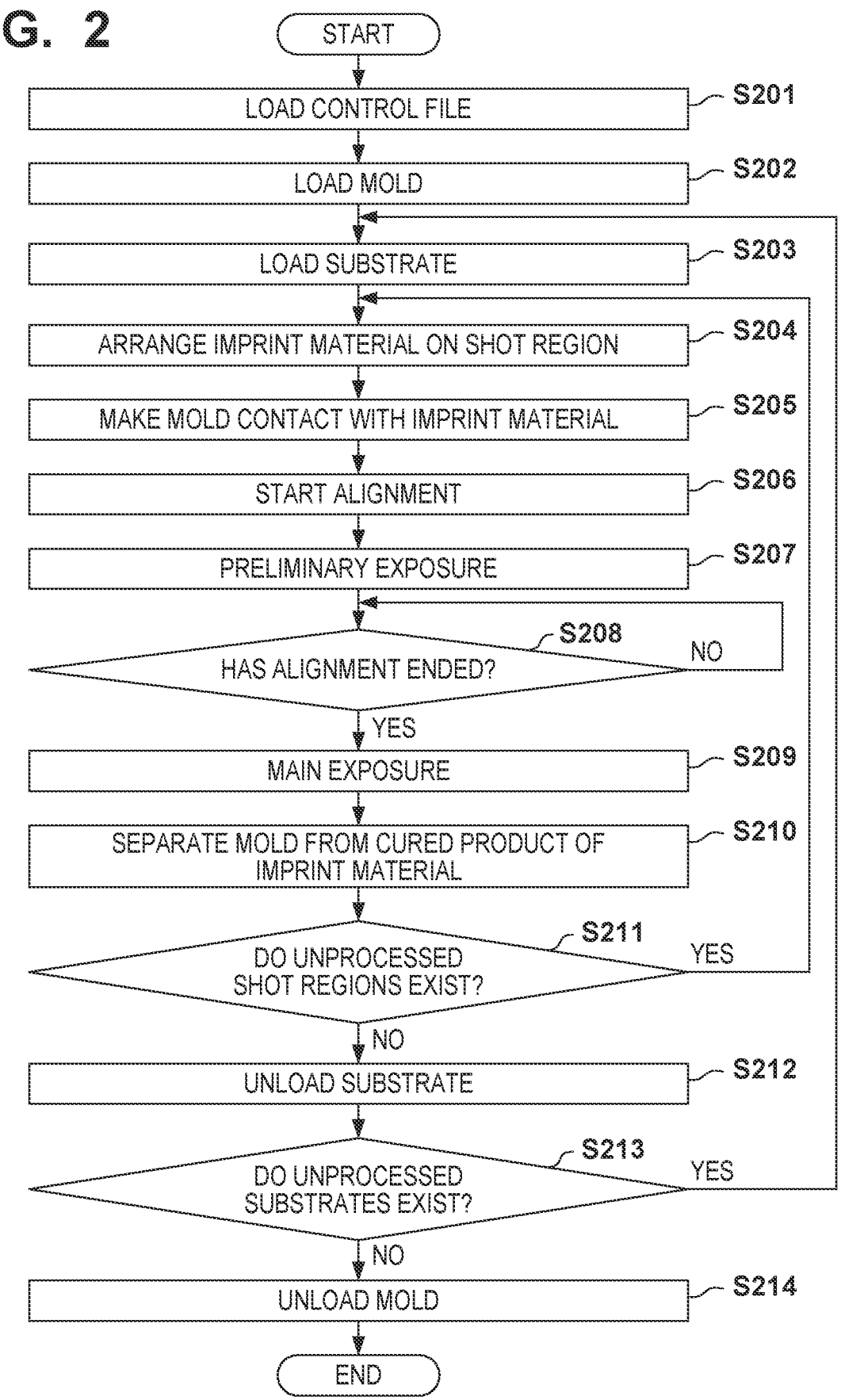
FIG. 2 is a view exemplarily showing the procedure of processing of forming a pattern using an imprint material on one or a plurality of substrates by the imprint apparatus according to an embodiment of the present invention.

FIG. 2 exemplarily shows the procedure of processing of forming a pattern of the imprint material IM using the mold M on one or a plurality of substrates S by the imprint apparatus 100. This processing is controlled by the control unit 11. In step S201, the control unit 11 loads a control file from a memory or a device (not shown). This control file can include, for example, information representing the array of a plurality of shot regions of the substrate S, information for controlling preliminary exposure, information for controlling main exposure, and information for specifying a position to arrange the imprint material IM by the dispenser 25.

In step S202, the control unit 11 controls a mold conveyance mechanism (not shown) and the mold positioning mechanism 7 such that the mold M is loaded and held by the mold holding unit of the mold positioning mechanism 7. In step S203, the control unit 11 controls a substrate conveyance mechanism (not shown) and the substrate positioning mechanism 21 such that the substrate S is loaded and held by the substrate holding unit 5.

In step S204, the control unit 11 controls the substrate positioning mechanism 21 and the dispenser 25 such that the imprint material IM is arranged on the shot region in which a pattern should be formed. If the imprint material IM is arranged on the substrate S in an external apparatus of the imprint apparatus 100, step S204 is unnecessary. In step S205, the control unit 11 controls the relative driving mechanism 20 and the adjustment mechanism 28 such that the imprint material IM on the shot region in which a pattern should be formed and the pattern region PR of the mold M come into contact. As will be described later, step S205 can be controlled such that after a part of the pattern region PR comes into contact with the imprint material IM on the shot region in which a pattern should be formed, the region where the imprint material IM and the pattern region PR are in contact expands.

In step S206, the control unit 11 starts an operation of controlling the relative driving mechanism 20 such that the alignment error becomes small while detecting, using the alignment scope 15, the alignment error between the pattern region PR and the shot region in which a pattern should be formed. In step S207, the control unit 11 controls the light irradiator IRR to perform preliminary exposure. By the preliminary exposure, the viscosity of the imprint material IM increases. The substrate S and the mold M are thus connected by the imprint material IM, and a relative vibration between the substrate S and the mold M in a state in which the mold M and the imprint material IM are in contact is reduced. Hence, the alignment accuracy between the shot region of the substrate S and the pattern region PR of the mold M can improve. Here, the preliminary exposure is executed under a condition (for example, an illuminance distribution) that filling of the imprint material IM in the concave portion of the pattern region PR of the mold M or in the space between the substrate S and the pattern region PR is sufficiently performed all over the shot region. Such a condition of preliminary exposure will be described later. The preliminary exposure may divisionally be executed a plurality of times.

In step S208, the control unit 11 determines whether the alignment started in step S206 has ended. Upon determining that the alignment has ended, the process advances to step S209. On the other hand, upon determining that the alignment has not ended, the control unit 11 repeats the alignment operation of step S206 and determines the end of alignment again in step S208. Here, the control unit 11 can determine that the alignment has ended when the alignment error detected using the alignment scope 15 falls within an allowable value. Alternatively, the control unit 11 may determine that the alignment has ended if the time elapsed from the start of step S206 reaches a predetermined time. In this case, the predetermined time can be set to obtain a sufficiently high alignment accuracy.

In step S209, the control unit 11 controls the light irradiator IRR to perform main exposure of further irradiating the imprint material IM with light. In the main exposure, for example, the imprint material IM is irradiated with light such that the light irradiation amount for the imprint material IM becomes a predetermined irradiation amount throughout the shot region to enable separation of the cured product of the imprint material IM from the mold M. A pattern constituted by the cured product of the imprint material IM is thus formed on the shot region in which the pattern of the substrate S should be formed. In step S210, the control unit 11 controls the relative driving mechanism 20 to separate the mold M from the pattern constituted by the cured product of the imprint material IM.

In step S211, the control unit 11 determines whether unprocessed shot regions exist. If unprocessed shot regions exist, steps S204 to S210 are executed for one of the unprocessed shot regions. If the processing has ended for all shot regions to be processed, in step S212, the control unit 11 controls the substrate conveyance mechanism (not shown) and the substrate positioning mechanism 21 to unload the substrate S from the substrate holding unit 5. In step S213, the control unit 11 determines whether unprocessed substrates exist. If unprocessed substrates exist, steps S203 to S210 are executed for one of the unprocessed substrates. If the processing has ended for all substrates to be processed, in step S214, the control unit 11 controls the mold conveyance mechanism (not shown) and the mold positioning mechanism 7 to unload the mold M from the mold holding unit of the mold positioning mechanism 7. The processing of one example shown in FIG. 2 thus ends.

FIGS. 3A to 3D exemplarily show adjustment of the shape (the shape on a section parallel to the Z-axis) of the mold M by the adjustment mechanism 28 and adjustment of the relative position between the substrate S and the mold M by the relative driving mechanism 20 in step S205. The left side of each of FIGS. 3A to 3D schematically shows the contact region between the imprint material IM on a shot region SR of the substrate S and the pattern region PR of the mold M. The right side of each of FIGS. 3A to 3D schematically shows the shape of the mold M on the section parallel to the Z-axis and the relative position between the substrate S and the mold M.

Figure 3A:
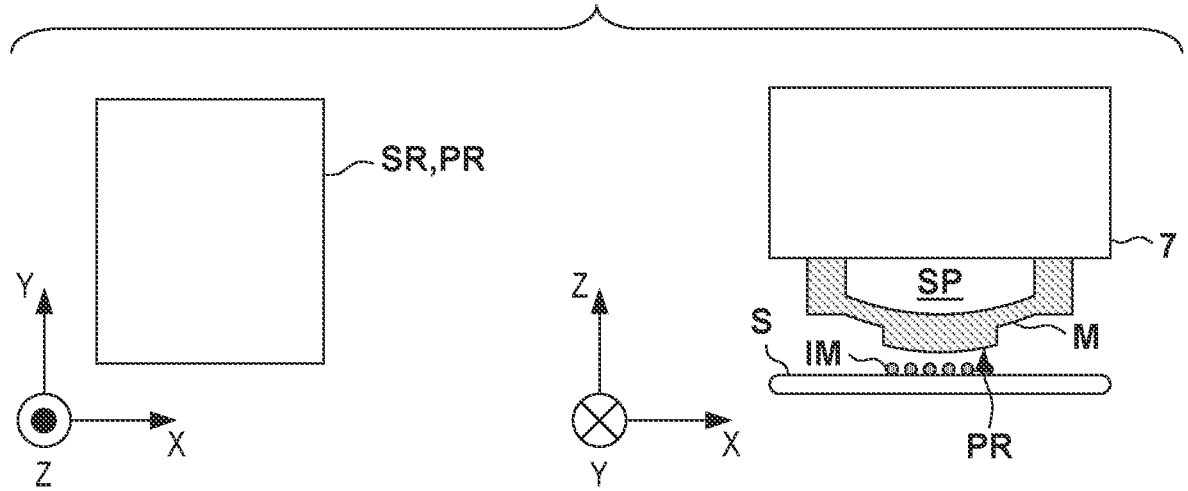
FIGS. 3A to 3D are views exemplarily showing adjustment of the shape of a mold by an adjustment mechanism and adjustment of the relative position between the substrate and the mold by a relative driving mechanism in a step of bringing the imprint material on the substrate into contact with the pattern region of the mold.
Figure 3B:
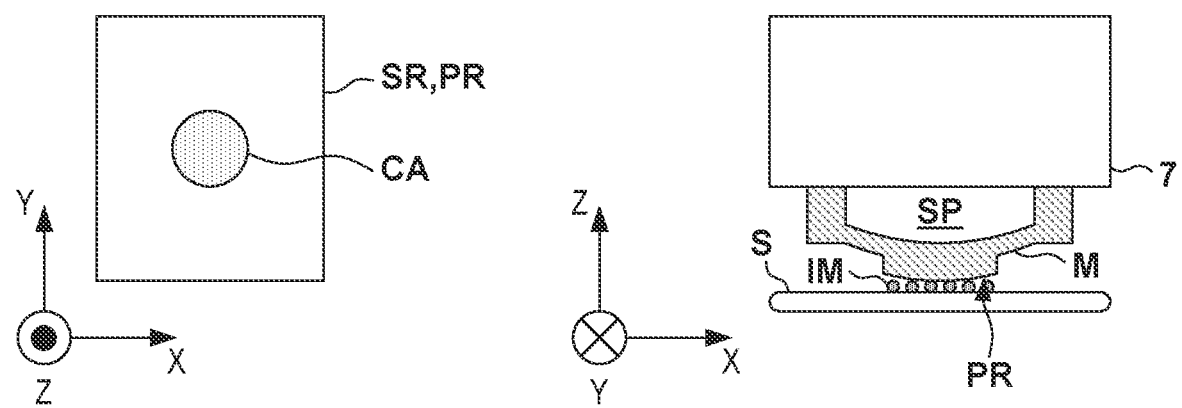

First, as schematically shown in FIG. 3A, the adjustment mechanism 28 can control (increase) the pressure in the space SP such that the pattern region PR of the mold M expands in a convex shape toward the substrate S. Next, as schematically shown in FIG. 3B, the relative driving mechanism 20 adjusts the relative position between the substrate S and the mold M such that the imprint material IM on the substrate S and the pattern region PR come into partial contact. A contact beginning region where the imprint material IM on the substrate S and the pattern region PR begin to contact is, for example, the center portion of the shot region.

Figure 3C:
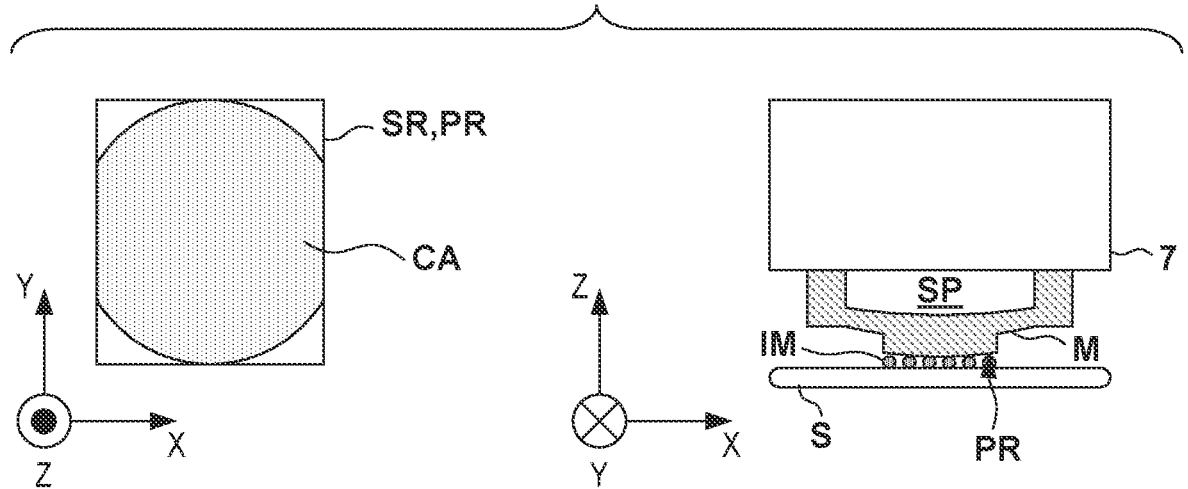

Next, as schematically shown in FIG. 3C, the adjustment mechanism 28 can control (decrease) the pressure in the space SP such that the expansion of the convex shape of the pattern region PR of the mold M becomes small. In parallel to this, the relative driving mechanism 20 can control the relative position (distance) between the substrate S and the mold M such that the imprint material IM and the pattern region PR come into contact in the whole shot region. A final contact region in which the imprint material IM on the substrate S and the pattern region PR finally come into contact is, for example, the peripheral portion of the shot region.

Figure 3D:
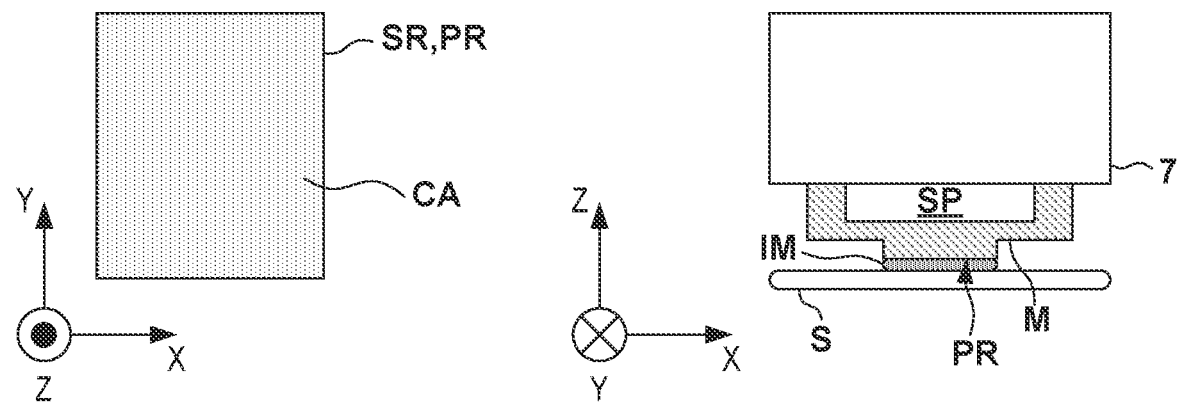

Finally, as schematically shown in FIG. 3D, the adjustment mechanism 28 controls the pressure in the space SP such that the substrate S and the pattern region PR become parallel, that is, the pattern region PR becomes flat. In a state in which the pattern region PR is flat, the concave portion of the pattern region PR and the whole space between the shot region of the substrate S and the pattern region PR are filled with the imprint material IM.

Step S206 (the start of alignment) may be executed in the state shown in FIG. 3A, may be executed in the state shown in FIG. 3B, may be executed in the state shown in FIG. 3C, or may be executed in the state shown in FIG. 3D. Step S207 (preliminary exposure) can be executed in a state in which the imprint material IM on the shot region and the pattern region PR are in contact, and the pattern region PR is flat. Alternatively, step S207 (preliminary exposure) can be executed after the imprint material IM and the pattern region PR begin to contact before the alignment between the substrate S and the mold M ends.

A filling failure of the imprint material IM in the concave portion of the pattern region PR and in the space between the shot region of the substrate S and the pattern region PR tends to occur in the contact beginning region (for example, the center portion) and in the final contact region (for example, the peripheral portion, in particular, four corners). The reason will be described below. For the sake of a detailed description, a description will be made here assuming that the contact beginning region is the center portion of the shot region SR. However, the contact beginning region may be a portion (for example, the peripheral portion) other than the center portion of the shot region SR.

The reason why the filling failure readily occurs in the contact beginning region will be described first. When the contact between the imprint material IM and the pattern region PR is started at the center portion of the shot region SR, the purge gas that exists between the substrate S and the pattern region PR can radially be pushed out from the center portion. However, the imprint material IM arranged at the position surrounding the center portion may impede the movement of the purge gas. Bubbles generated by the purge gas can decrease when, for example, the purge gas dissolves in the imprint material IM or condenses. However, when the wait time after the contact between the imprint material IM and the pattern region PR is shortened, some bubbles may remain. For this reason, if the wait time after the contact between the imprint material IM and the pattern region PR is shortened, the filling failure readily occurs in the contact beginning region, and the yield may lower. Additionally, if the wait time is shortened, throughput may lower.

The reason why the filling failure readily occurs in the final contact region will be described next. The final contact region is a region where the contact between the imprint material IM and the pattern region PR occurs latest. The final contact region is a region in which the time that can be consumed to push out the purge gas and dissolve the purge gas in the imprint material IM or condense the purge gas to eliminate bubbles is shortest in the shot regions. For this reason, if the wait time after the contact between the imprint material IM and the pattern region PR is shortened, the filling failure readily occurs in the contact beginning region, and the yield may lower. Additionally, if the wait time is shortened, throughput may lower.

To reduce filling failures in the contact beginning region and the final contact region, a method of increasing the force of pressing the mold M against the imprint material IM on the substrate S is used. In this method, however, the pressure applied to the imprint material IM in a region other than the final contact region excessively becomes high, and the imprint material IM may move from the region where filling is already completed. If the movement of the imprint material occurs as if the imprint material IM overflows from the shot region, the imprint material IM may act as a foreign substance on the substrate S, resulting in a defect or breakage of the mold M.

In addition, the filling failure may depend on the feature of patterns provided in the pattern region PR of the mold M. The patterns can include a plurality of marks such as alignment marks in addition to a plurality of devices patterns. The shot region SR of the substrate S includes a plurality of chip regions isolated from each other by scribe lines, and a plurality of marks can be arranged on the scribe lines. Similarly, the pattern region PR of the mold M also includes a plurality of chip regions isolated from each other by scribe lines, and a plurality of marks can be arranged on the scribe lines. In many cases, the density of device patterns and that of marks are different from each other. In addition, device patterns may also have densities different from each other. Such a density difference may affect the filling of the imprint material IM.

The surface of the substrate S also has unevenness formed by already existing patterns, and a density difference may exist in the unevenness. Such a density difference may affect the filling of the imprint material IM.

Preliminary exposure increases the viscosity or hardness of the imprint material IM and therefore lowers the filling property of the imprint material IM. In other words, preliminary exposure contributes to improvement of the alignment accuracy but may lower the filling property of the imprint material IM and cause a filling failure. In this embodiment, preliminary exposure is executed under a condition (for example, the illuminance distribution) considering the distribution of filling property in the shot region SR of the substrate S or the pattern region PR of the mold M.

Figure 4A:
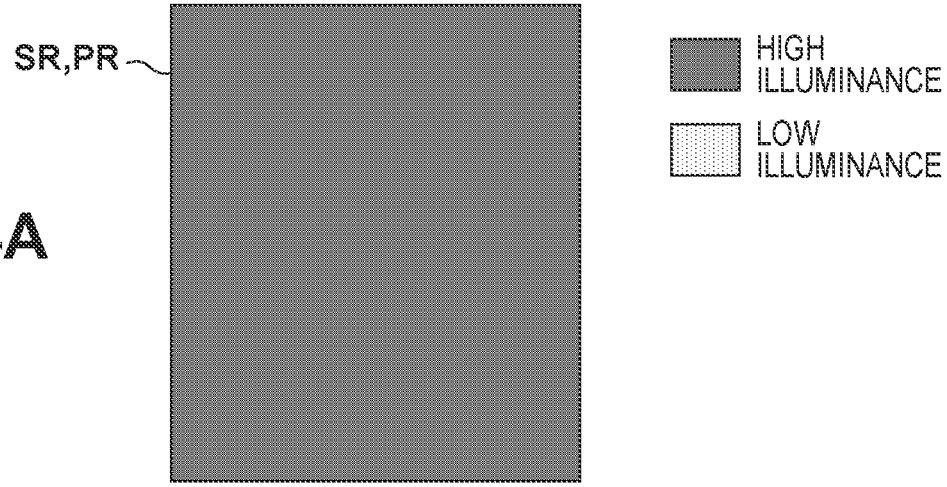
FIGS. 4A to 4C are views exemplarily showing a comparative example, the first example, and the second example of an illuminance distribution at the time of preliminary exposure.

FIG. 4A schematically shows an illuminance distribution at the time of preliminary exposure in a comparative example. In the comparative example shown in FIG. 4A, preliminary exposure (light irradiation for the imprint material IM) is performed under an illuminance distribution having a uniform illuminance in the shot region SR (pattern region PR).

Figure 4B:
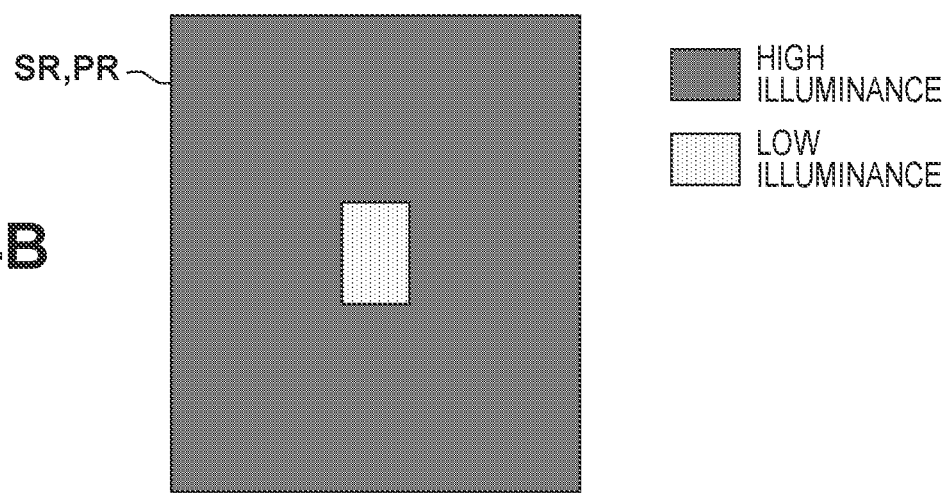

FIG. 4B schematically shows an illuminance distribution at the time of preliminary exposure in the first example. A region hatched in a dark color is a high illuminance region, and a region hatched in a light color is a low illuminance region. In the first example shown in FIG. 4B, the control unit 11 can control the light irradiator IRR such that, for example, preliminary exposure is performed in a state in which the imprint material on the shot region SR and the pattern region PR are in contact, and the pattern region PR is flat. Additionally, in the first example shown in FIG. 4B, the control unit 11 determines the illuminance distribution such that the illuminance in the contact beginning region (here, the center portion) is lower than that in the remaining regions, and controls the light irradiator IRR such that preliminary exposure (light irradiation for the imprint material IM) is performed under such an illuminance distribution. In other words, in the first example, the light irradiator IRR irradiates the imprint material with light under an illuminance distribution determined such that the illuminance in the contact beginning region where the contact between the imprint material and the pattern region PR starts is lower than the illuminance in a certain region different from the contact beginning region. This can improve the filling property in the contact beginning region.

Figure 4C:
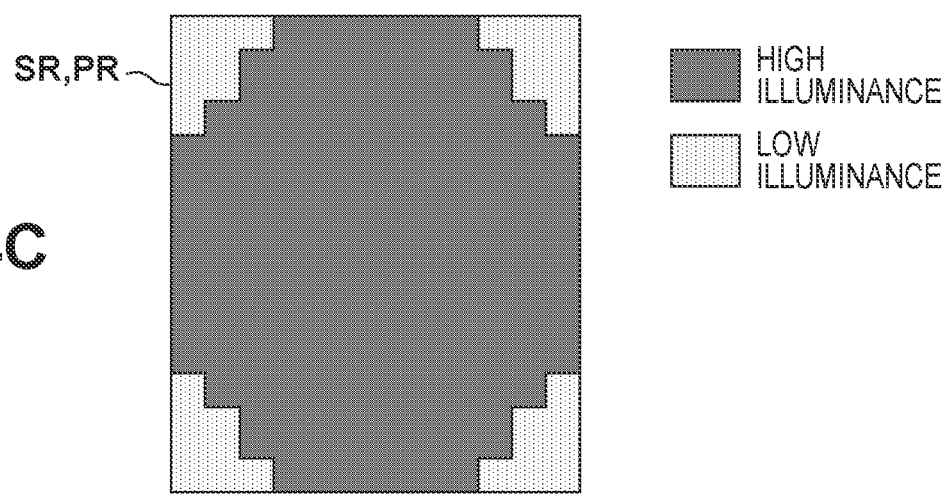

FIG. 4C schematically shows an illuminance distribution at the time of preliminary exposure in the second example. In the second example shown in FIG. 4C, the control unit 11 can control the light irradiator IRR such that preliminary exposure is performed in a state in which the imprint material on the shot region SR and the pattern region PR are in contact, and the pattern region PR is flat. Additionally, in the second example shown in FIG. 4C, the control unit 11 determines the illuminance distribution such that the illuminance in the final contact region (here, the peripheral portion or four corners) is lower than that in the remaining regions, and controls the light irradiator IRR such that preliminary exposure (light irradiation for the imprint material IM) is performed under such an illuminance distribution. In other words, in the second example, the light irradiator IRR irradiates the imprint material with light under an illuminance distribution determined such that the illuminance in the final contact region where the imprint material and the pattern region PR finally come into contact is lower than the illuminance in a certain region different from the final contact region. This can improve the filling property in the final contact region.

In the first and second examples, the light irradiator IRR may be controlled by the control unit 11 such that preliminary exposure is performed after the imprint material and the pattern region PR begin to contact before the alignment between the substrate S and the mold M ends. That is, in the first and second examples, the control unit 11 may control the light irradiator IRR such that preliminary exposure is performed before the imprint material on the shot region SR and the pattern region PR come into contact to make the pattern region PR flat. The first and second examples can also be understood as an example of processing of determining the illuminance distribution in accordance with processing of increasing the contact area between the imprint material IM and the pattern region PR by the adjustment mechanism 28.

Figure 5A:
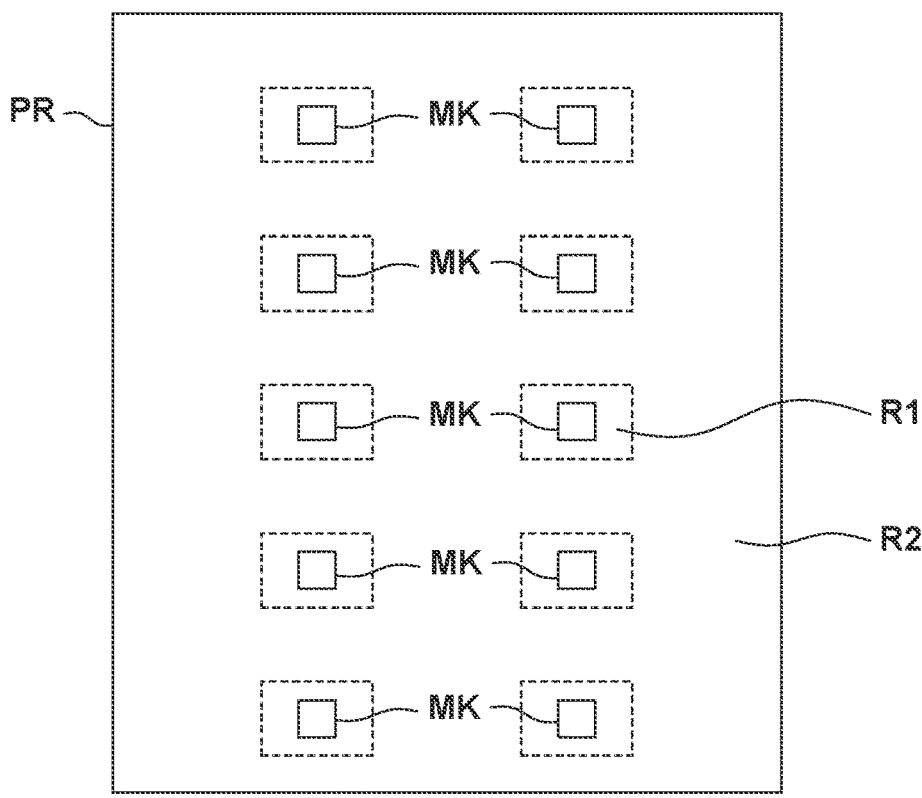
FIGS. 5A and 5B are views exemplarily showing a pattern region of a mold in the third example and an illuminance distribution at the time of preliminary exposure in the third example.

FIG. 5A exemplarily shows the pattern region PR of the mold M in the third example. In the pattern region PR, a plurality of marks MK are arranged in addition to a plurality of device patterns (not shown). For example, the pattern region PR includes a plurality of chip pattern regions corresponding to a plurality of chip regions, and scribe regions that isolate them from each other. The marks MK can be arranged in the scribe regions. The pattern region PR includes a first region R1 and a second region R2. Here, because of the existence of the mark MK, the filling property of the imprint material for the pattern existing in the first region R1 is poorer than the filling property of the imprint material for the pattern existing in the second region R2.

Figure 5B:
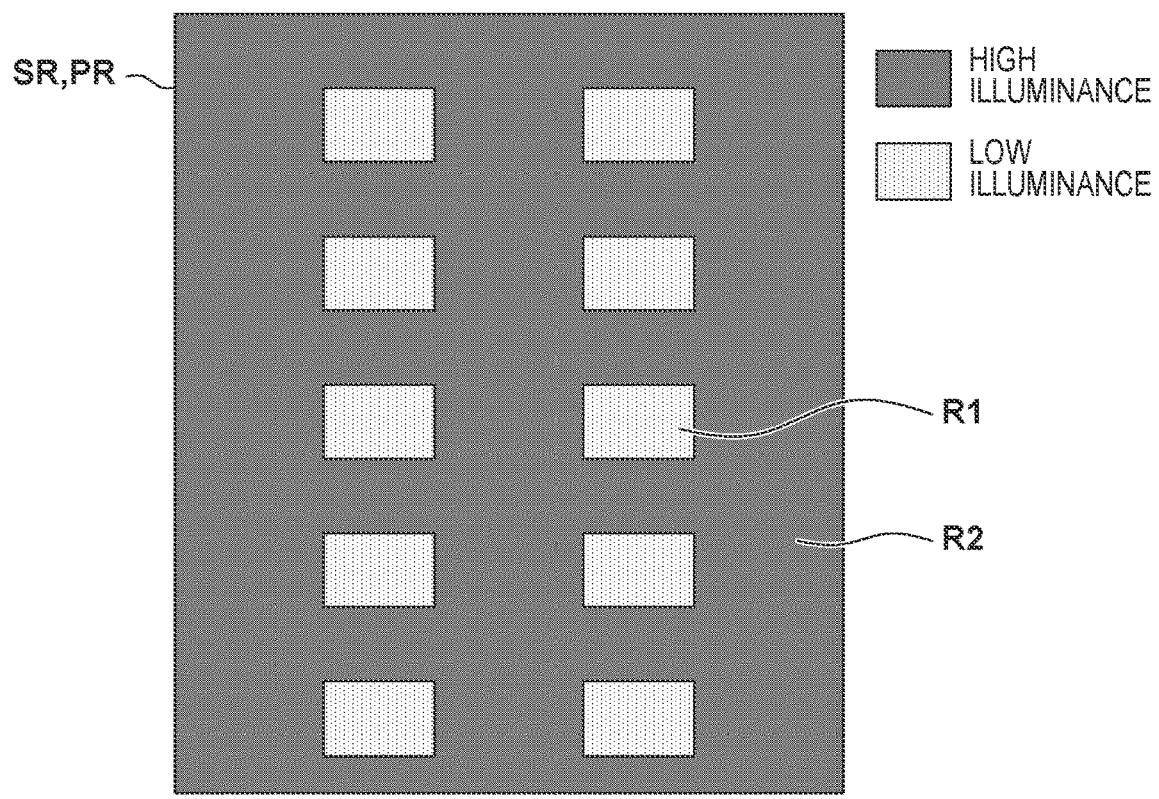

FIG. 5B schematically shows an illuminance distribution at the time of preliminary exposure in the third example. The illuminance distribution of the third example shown in FIG. 5B is determined in accordance with the pattern region PR shown in FIG. 5A. A region hatched in a dark color is a high illuminance region, and a region hatched in a light color is a low illuminance region. In the third example shown in FIG. 5B, the control unit 11 can control the light irradiator IRR such that preliminary exposure is performed in a state in which the imprint material on the shot region SR and the pattern region PR are in contact, and the pattern region PR is flat. Additionally, the control unit 11 determines the illuminance distribution such that the illuminance in the first region R1 is lower than that in the second region R2, and controls the light irradiator IRR such that preliminary exposure (light irradiation for the imprint material IM) is performed under such an illuminance distribution. In other words, in the third example, the light irradiator IRR irradiates the imprint material with light under an illuminance distribution determined such that the illuminance in the first region R1 is lower than the illuminance in the second region R2.

The light irradiator IRR may be controlled by the control unit 11 such that preliminary exposure of irradiating the imprint material with light to increase the viscosity of the imprint material is performed after the imprint material and the pattern region PR begin to contact before the alignment between the substrate S and the mold M ends. That is, in the third example, the control unit 11 may control the light irradiator IRR such that preliminary exposure is performed before the imprint material on the shot region SR and the pattern region PR come into contact to make the pattern region PR flat. In the preliminary exposure, the light irradiator IRR can irradiate the imprint material with light in an illuminance distribution determined in accordance with the pattern in the pattern region PR.

In a modification of the third example, the illuminance distribution at the time of preliminary exposure is determined in accordance with unevenness of the shot region SR of the substrate S. Here, the shot region SR includes a third region and a fourth region. In addition, the filling property of the imprint material IM for a region of the pattern region PR of the mold M facing the third region is poorer than the filling property of the imprint material IM for a region of the pattern region PR of the mold M facing the fourth region. In this case, the control unit 11 determines the illuminance distribution such that the illuminance in the third region is lower than that in the fourth region, and controls the light irradiator IRR such that preliminary exposure (light irradiation for the imprint material IM) is performed under such an illuminance distribution. In other words, in the modification, the light irradiator IRR irradiates the imprint material IM with light under an illuminance distribution determined such that the illuminance in the third region is lower than the illuminance in the fourth region.

Figure 6A:
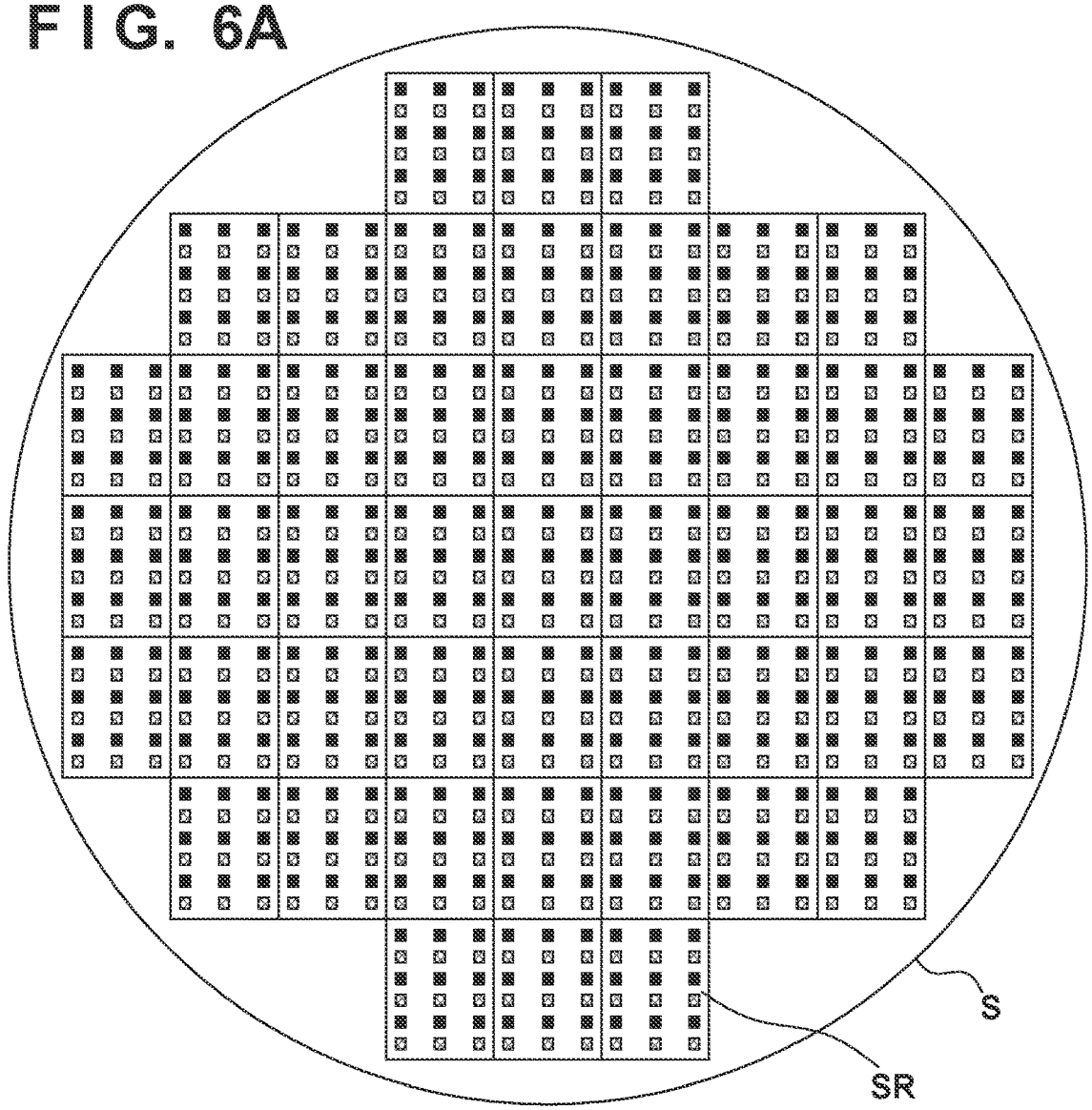
FIGS. 6A and 6B are views for explaining unevenness existing on the surface of a substrate.
Figure 6B:
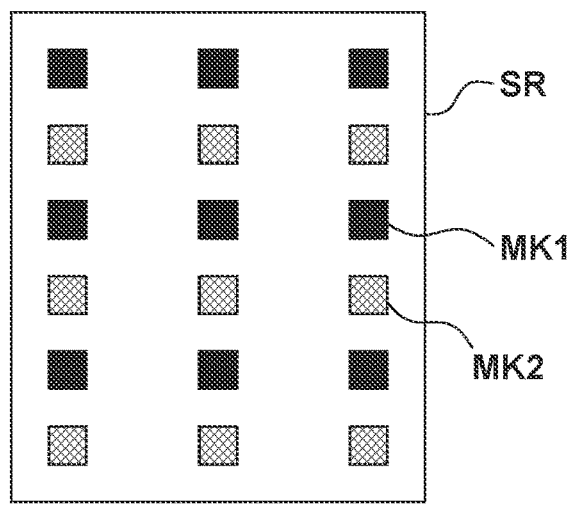

An example of unevenness existing on the surface of the substrate S will be described here with reference to FIGS. 6A and 6B. FIG. 6A shows an example of the arrangement of a plurality of shot regions SR on the substrate S. FIG. 6B schematically shows one shot region SR. Each shot region SR includes a plurality of chip regions isolated from each other by scribe lines, and marks MK1 and MK2 are arranged on the scribe lines. For example, when forming a pattern using the imprint apparatus 100, the marks MK1 can be used for alignment. When forming the pattern of the next layer, the marks MK2 can be used for alignment. The marks to be used may change in accordance with the step or the apparatus to be used, and a number of marks can therefore exist. Such a mark is a representative example that has corresponding unevenness and impedes filling of the imprint material.

Figure 7:
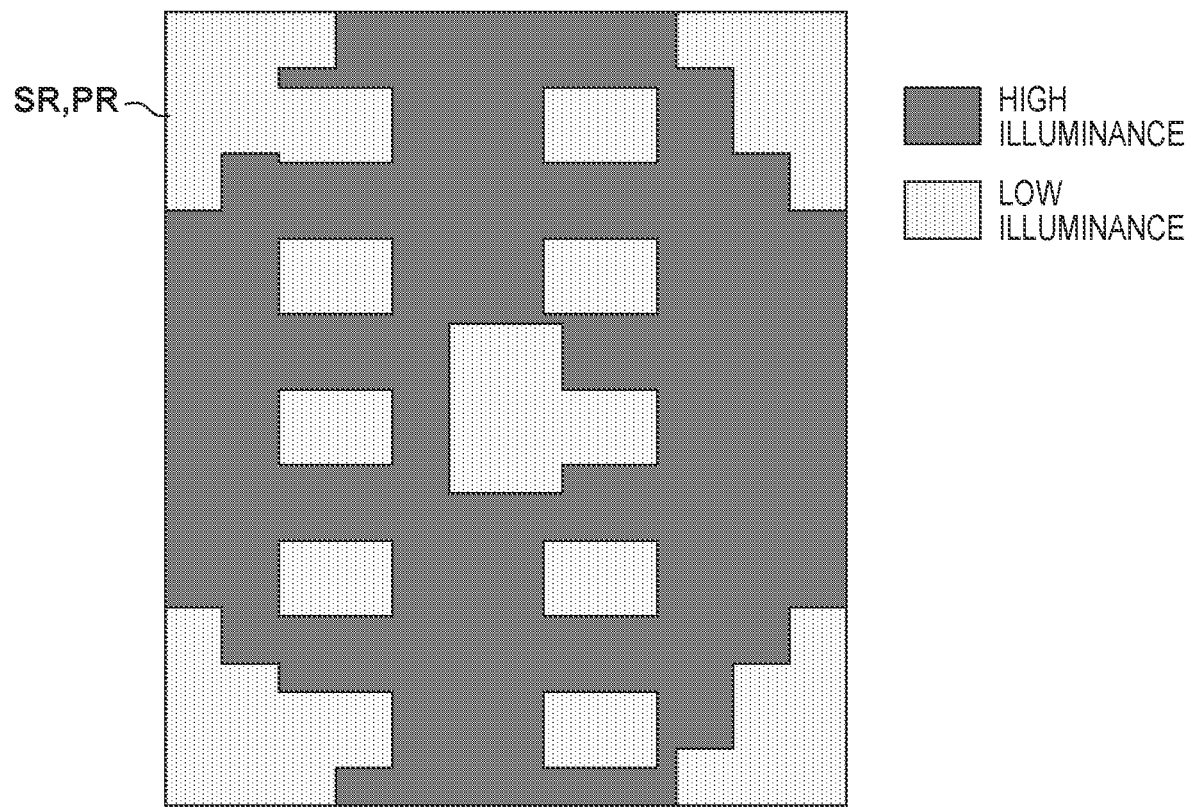
FIG. 7 is a view exemplarily showing an illuminance distribution that combines the first to third examples.

The illuminance distributions considering the filling property of the imprint material IM, which are represented by the above-described first to third examples, can be used in combination with each other. FIG. 7 exemplarily shows an illuminance distribution that combines the first example shown in FIG. 4B, the second example shown in FIG. 4C, and the third example shown in FIG. 5B. For example, the control unit 11 can obtain the illuminance distribution that combines the first to third examples by setting a high illuminance unit region to 0 and a low illuminance unit region to 1 and performing an OR operation for each unit region. Alternatively, the control unit 11 can obtain the illuminance distribution that combines the first to third examples by setting a high illuminance unit region to 1 and a low illuminance unit region to 0 and performing an AND operation for each unit region. The unit region can be defined by, for example, the minimum resolution of the spatial light modulator 16. In other words, the unit region can be a minimum region whose illuminance can be controlled by the spatial light modulator 16. If the spatial light modulator 16 can generate an intermediate illuminance (a plurality of illuminances other than 0), the illuminance in each unit region may be determined based on the sum of illuminances in the unit regions of the first to third examples. If the spatial light modulator 16 cannot generate an intermediate illuminance, the sum may be binarized by an error diffusion method or the like.

Two arbitrary examples of the first to third examples may be combined. Furthermore, an illuminance distribution generated based on another criterion may be combined.

An irradiation integrated amount that is the spatial integrated amount (the sum (spatial integrated value) of illuminances in the whole shot region) of light irradiation amounts in preliminary exposure may be decided in advance. Such an irradiation integrated amount can be decided based on a plurality of factors such as the composition of the imprint material, the vibration state of the imprint apparatus, and the area of the shot region. In this case, when the illuminance in preliminary exposure is partially lowered, the irradiation integrated amount becomes smaller than a reference integrated amount. Hence, the illuminance in a region with an excellent filling property may be increased.

The irradiation integrated amount can be calculated by, for example, the product of an irradiation area, an illuminance, and an irradiation time. Depending on the imprint material, other components such as a reaction speed that changes depending on the imprint material, the wavelength of irradiation light, and the like may be taken into consideration as coefficients. As a method of adjusting the irradiation integrated amount, an example in which the irradiation integrated amount is adjusted by the illuminance and an example in which the irradiation time is adjusted will be described below.

An example in which the irradiation integrated amount is adjusted by adjusting the illuminance will be described first with reference to FIGS. 8A to 8D. First, the irradiation integrated amount is calculated by $$\text{irradiation integrated amount} = \text{irradiation area(vertical} \times \text{horizontal)} \times \text{illuminance} \times \text{irradiation time} \quad (1)$$

Here, as an example, an example in which the irradiation area is 20, and the shot region is divided into five regions in the vertical direction and four regions in the horizontal direction will be described. FIG. 8A is an explanatory view of a case in which an illuminance given to each divided region is 5, and the irradiation time is 1. In this case, the irradiation integrated amount is calculated as 100 in accordance with equation (1).

Here, as an example, as shown in FIG. 8B, the illuminance at the center portion that is the contact beginning region is lowered from 5 to 3 in accordance with the first example. Hence, the irradiation integrated amount changes from 100 to 96, that is, decreases by 4.

As shown in FIG. 8C, when the decrease amount of the irradiation integrated amount, that is, 4 is distributed to the entire irradiation region, the irradiation integrated amount can be increased to 100. Alternatively, if the illuminance in the contact beginning region should not be 3 or more, as shown in FIG. 8D, the decrease amount of the irradiation integrated amount, that is, 4 may be distributed to regions other than the contact beginning region.

An example in which the irradiation integrated amount is adjusted by adjusting the irradiation time will be described next. The irradiation time can be adjusted by, for example, irradiation time(after adjustment)=(irradiation integrated amount(optimum value)÷irradiation integrated amount(current value))×irradiation time (current value)  (2)

The irradiation integrated amount (optimum value) is a reference integrated value, and is 100 in the above-described example. The irradiation integrated amount (current value) is 96 in the above-described example. The irradiation time (current value) is 1 in the above-described example. According to equation (2), the irradiation time (after adjustment) is 1.04.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 9A:
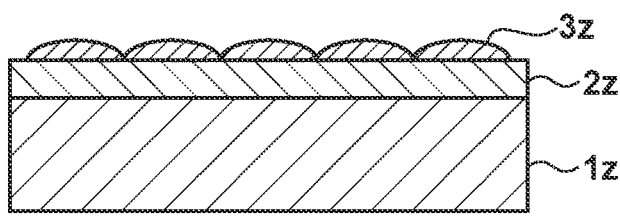
FIGS. 9A to 9F are views exemplarily showing an article manufacturing method.

An article manufacturing method in which an imprint apparatus forms a pattern on a substrate, processes the substrate on which the pattern is formed, and manufactures an article from the processed substrate will be described next. As shown FIG. 9A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 9B:
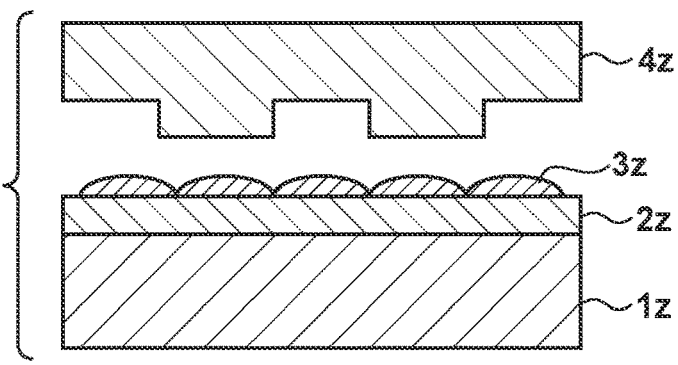
Figure 9C:
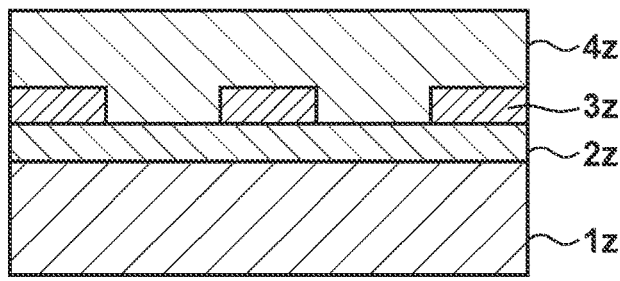

As shown in FIG. 9B, a side of a mold $4z$ for imprint with a concave-convex pattern is directed toward and made to face the imprint material $3z$ on the substrate. As shown FIG. 9C, the substrate $1z$ to which the imprint material $3z$ is applied is brought into contact with the mold $4z$, and a pressure is applied. The gap between the mold $4z$ and the processed material $2z$ is filled with the imprint material $3z$. In this state, when the imprint material $3z$ is irradiated with light as energy for curing via the mold $4z$, the imprint material $3z$ is cured.

Figure 9D:
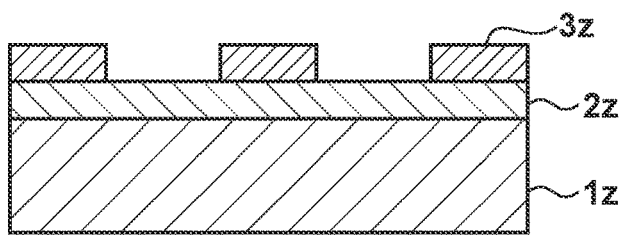

As shown in FIG. 9D, after the imprint material $3z$ is cured, the mold $4z$ is separated from the substrate $1z$, and the pattern of the cured product of the imprint material $3z$ is formed on the substrate $1z$. In the pattern of the cured product, the concave portion of the mold corresponds to the convex portion of the cured product, and the convex portion of the mold corresponds to the concave portion of the cured product. That is, the concave-convex pattern of the mold $4z$ is transferred to the imprint material $3z$.

Figure 9E:
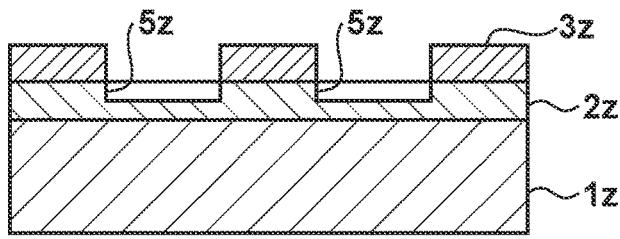
Figure 9F:
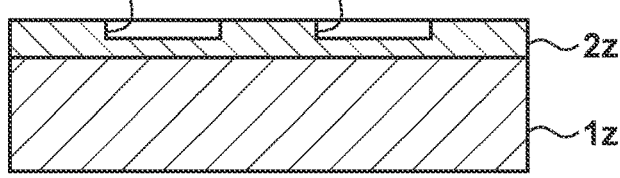

As shown in FIG. 9E, when etching is performed using the pattern of the cured product as an etching resistant mask, a portion of the surface of the processed material $2z$ where the cured product does not exist or remains thin is removed to form a groove $5z$. As shown in FIG. 9F, when the pattern of the cured product is removed, an article with the grooves $5z$ formed in the surface of the processed material $2z$ can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-238651 filed Dec. 20, 2018, which is hereby incorporated by reference herein in its entirety.

What is claimed is:

1. An imprint apparatus that brings a pattern region of a mold into contact with an imprint material on a shot region of a substrate, performs alignment between the shot region and the pattern region with each other, and cures the imprint material, thereby forming a pattern constituted by a cured product of the imprint material on the substrate, the apparatus comprising:

a light irradiator configured to irradiate the imprint material with light; and a controller including (i) a circuit configured to control the light irradiator, (ii) a computer having a memory storing a program that, when executed by the computer, causes the computer to control the light irradiator, or both (i) and (ii), the controller being configured to cause the light irradiator to, before the alignment is ended and in a state in which the imprint material on the shot region and the pattern region are in contact, perform a preliminary exposure of irradiating the imprint material with the light to increase a viscosity of the imprint material, wherein in the preliminary exposure performed before the alignment is ended and in the state in which the imprint material on the shot region and the pattern region are in contact, the controller is configured to control the light irradiator such that an irradiation integrated amount of the preliminary exposure in a contact beginning region of an irradiation region, where the imprint material and the pattern region begin to contact, and in a final contact region of the irradiation region, where the imprint material and the pattern region finally come into contact, is smaller than an irradiation integrated amount of the preliminary exposure in a certain region of the irradiation region different from the contact beginning region and the final contact region, and wherein after the preliminary exposure and the alignment between the substrate and the mold is ended, the controller is configured to control the light irradiator to irradiate the imprint material with light of a main exposure to cure the imprint material.

2. The apparatus according to claim 1, wherein the contact beginning region is a center portion of the shot region, and the final contact region is a peripheral portion of the shot region.

3. The apparatus according to claim 1, wherein after the alignment between the substrate and the mold is ended, the controller is configured to cause the light irradiator to perform a main exposure of further irradiating the imprint material with light for the main exposure, and in the main exposure, the imprint material is irradiated with the light for the main exposure to enable separation of the cured product of the imprint material from the mold.

4. The apparatus according to claim 1, wherein the light irradiator includes a spatial light modulator that is controlled by the controller to generate the light having the controlled irradiation integrated amount.

5. The apparatus according to claim 1, wherein the viscosity of the imprint material in the contact beginning region after the preliminary exposure is smaller than the viscosity of the imprint material in the certain region after the preliminary exposure.

6. An imprint apparatus that brings a pattern region of a mold into contact with an imprint material on a shot region of a substrate, performs alignment between the shot region and the pattern region with each other, and cures the imprint material, thereby forming a pattern constituted by a cured product of the imprint material on the substrate, the apparatus comprising:
   a light irradiator configured to irradiate the imprint material with light; and
   a controller including (i) a circuit configured to control the light irradiator, (ii) a computer having a memory storing a program that, when executed by the computer, causes the computer to control the light irradiator, or both (i) and (ii), the controller being configured to cause the light irradiator to, before the alignment is ended and in a state in which the imprint material on the shot region and the pattern region are in contact, perform a preliminary exposure of irradiating the imprint material with the light to increase a viscosity of the imprint material,
   wherein in the preliminary exposure performed before the alignment is ended and in the state in which the imprint material on the shot region and the pattern region are in contact, the controller is configured to control the light irradiator such that an irradiation integrated amount of the preliminary exposure in a final contact region of an irradiation region, where after the imprint material and the pattern region begin to contact, the imprint material and the pattern region finally come into contact, is smaller than an irradiation integrated amount of the preliminary exposure in a certain region of the irradiation region different from the final contact region,
   wherein after the preliminary exposure and the alignment between the substrate and the mold is ended, the controller is configured to control the light irradiator to irradiate the imprint material with light of a main exposure to cure the imprint material, and
   wherein the final contact region is a peripheral portion of the shot region, and the certain region is a center portion of the shot region.

7. The apparatus according to claim 6, wherein the pattern region includes a first region and a second region, and a filling property of the imprint material for a pattern existing in the first region is poorer than a filling property of the imprint material for a pattern existing in the second region, and
   the controller is further configured to control the light irradiator such that, that an irradiation integrated amount of the preliminary exposure in the first region is smaller than an irradiation integrated amount of the preliminary exposure in the second region.

8. The apparatus according to claim 6, wherein the light irradiator includes a spatial light modulator that is controlled by the controller to generate the light having the controlled irradiation integrated amount.

9. The apparatus according to claim 6, wherein the viscosity of the imprint material in the final contact region after the preliminary exposure is smaller than the viscosity of the imprint material in the certain region after the preliminary exposure.

10. An imprint apparatus that brings a pattern region of a mold into contact with an imprint material on a shot region of a substrate, performs alignment between the shot region and the pattern region with each other, and cures the imprint material, thereby forming a pattern constituted by a cured product of the imprint material on the substrate, the apparatus comprising:
    a light irradiator configured to irradiate the imprint material with light; and
    a controller including (i) a circuit configured to control the light irradiator, (ii) a computer having a memory storing a program that, when executed by the computer, causes the computer to control the light irradiator, or both (i) and (ii), the controller being configured to cause the light irradiator to, before the alignment is ended and in a state in which the imprint material on the shot region and the pattern region are in contact, perform a preliminary exposure of irradiating the imprint material with the light to increase a viscosity of the imprint material,
    wherein the pattern region includes a first region and a second region, and a filling property of the imprint material for a pattern existing in the first region is poorer than a filling property of the imprint material for a pattern existing in the second region,
    wherein the first region includes a first device pattern, for forming a first pattern on the substrate, and a mark used as an alignment mark when forming the first pattern on the substrate, and the second region includes a second device pattern, for forming a second pattern on the substrate, and does not include a mark used as an alignment mark when forming the second pattern on the substrate,
    wherein in the preliminary exposure performed before the alignment is ended and in the state in which the imprint material on the shot region and the pattern region are in contact, the controller is configured to control the light irradiator such that an irradiation integrated amount of the preliminary exposure in the first region is smaller than an irradiation integrated amount of the preliminary exposure in the second region, and
    wherein after the preliminary exposure and the alignment between the substrate and the mold is ended, the controller is configured to control the light irradiator to irradiate the imprint material with light of a main exposure to cure the imprint material.

11. The apparatus according to claim 10, wherein the shot region includes a third region and a fourth region, and the filling property of the imprint material for a region of the pattern region facing the third region is poorer than the filling property of the imprint material for a region of the pattern region facing the fourth region, and
    the controller is further configured to control the light irradiator such that an irradiation integrated amount of the preliminary exposure in the third region is smaller than an irradiation integrated amount of the preliminary exposure in the fourth region.

12. An imprint apparatus that brings a pattern region of a mold into contact with an imprint material on a shot region of a substrate, performs alignment between the shot region and the pattern region with each other, and cures the imprint material, thereby forming a pattern constituted by a cured product of the imprint material on the substrate, the apparatus comprising:

a light irradiator configured to irradiate the imprint material with light; and a controller including (i) a circuit configured to control the light irradiator, (ii) a computer having a memory storing a program that, when executed by the computer, causes the computer to control the light irradiator, or both (i) and (ii), the controller being configured to cause the light irradiator to, before the alignment is ended and in a state in which the imprint material on the shot region and the pattern region are in contact, perform a preliminary exposure of irradiating the imprint material with the light to increase a viscosity of the imprint material, wherein the shot region includes a first region and a second region, and a filling property of the imprint material for a region of the pattern region facing the first region is poorer than the filling property of the imprint material for a region of the pattern region facing the second region, wherein the first region includes a mark having unevenness and used for the alignment when the substrate is processed to fabricate an article, and the second region does not include a mark having unevenness and used for the alignment when the substrate is processed to fabricate an article, wherein in the preliminary exposure performed before the alignment is ended and in the state in which the imprint material on the shot region and the pattern region are in contact, the controller is configured to control the light irradiator such that an irradiation integrated amount of the preliminary exposure in the first region is smaller than an irradiation integrated amount of the preliminary exposure in the second region, and wherein after the preliminary exposure and the alignment between the substrate and the mold is ended, the controller is configured to control the light irradiator to irradiate the imprint material with light of a main exposure to cure the imprint material.

\* \* \* \* \*